United States Patent [19]

McCartney

[11] Patent Number: 5,675,334
[45] Date of Patent: Oct. 7, 1997

[54] ANALOG TO DIGITAL CONVERSION SYSTEM

[75] Inventor: Damien McCartney, Raheen, Ireland

[73] Assignee: Analog Devices, Inc., Norwood, Mass.

[21] Appl. No.: 599,811

[22] Filed: Feb. 12, 1996

[51] Int. Cl.$^6$ .................................................. H03M 1/06
[52] U.S. Cl. ........................ 341/118; 341/143; 341/155
[58] Field of Search ................................. 341/118, 120, 341/127, 143, 155

[56] References Cited

U.S. PATENT DOCUMENTS

| | | | |
|---|---|---|---|
| 4,608,553 | 8/1986 | Ormond | 341/118 |
| 5,039,989 | 8/1991 | Welland et al. | 341/143 |
| 5,148,167 | 9/1992 | Ribner | 341/143 |
| 5,179,380 | 1/1993 | White | 341/143 |

OTHER PUBLICATIONS

Jerome Johnston, "Signal Chopping Enhances Bridge Performance", EDN Jun. 22, 1995, p. 70.

*Primary Examiner*—Marc S. Hoff
*Attorney, Agent, or Firm*—Fish & Richardson P.C.

[57] ABSTRACT

An analog to digital conversion system wherein a first chopper is responsive to a chop signal having a period T for passing an analog signal to an output with non-reversed polarity during a first portion of the period T and with reversed polarity during a second portion of the period T. An analog to digital converter produces a first set of at least one digital word corresponding to the analog signal with non-reversed polarity and an offset voltage and produces a second set of at least one digital word corresponding to the analog signal with reversed polarity and the offset voltage. A second chopper is responsive to the chop signal for passing to an output of the second chopper one of the produced first and second sets with non-reversed polarity, and passing to the output of the second chopper the other one of produced first and second sets with reversed polarity. A filter is fed by the output of the second chopper for producing, on receipt of the produced first set, a first output digital word and, on receipt of the produced second set, a second output digital word, with the offset voltage being removed from each of such output digital words. In a preferred embodiment, a signal conditioning circuit is fed by the output of the first chopper.

16 Claims, 5 Drawing Sheets

ANALOG TO DIGITAL CONVERSION SYSTEM

BACKGROUND OF THE INVENTION

This invention relates generally to analog to digital conversion systems and more particularly to analog to digital conversion systems that require low offset voltages.

As is known in the art, many applications require the conversion of an analog signal into a corresponding digital signal for subsequent digital signal processing. As is also known in the art, many signal processing applications require low offset voltages and stability of the offset voltage with changes in temperature over a period of time. Further, in such applications, good low frequency (i.e., (1/f), where f is frequency) noise performance is also required. Because it is sometimes convenient to think of offset voltage as a particular manifestation of low frequency noise, namely zero-frequency noise, when the term offset voltage is used hereinafter such term may also include low frequency noise. Examples of applications that require low offset voltages are precision instrumentation applications, such as weigh-scale, thermocouple, or pressure measurement.

Because of the desirability to form both analog and digital processing circuitry as a single integrated circuit, there is a major trend to use complementary metal oxide semiconductor (CMOS) transistors in such circuits. Unfortunately, circuits made with CMOS transistors suffer more from offset voltage and low frequency noise problems than bipolar transistor circuitry which was formerly used more commonly for analog signal processing.

As is also known in the art, offset voltages can arise in the analog to digital converter (ADC) itself or in signal conditioning circuitry, such as buffers, amplifiers, programmable gain amplifiers (PGA), filters, sample and hold circuits, which may precede the ADC. In amplifiers, offset voltage can arise from mismatches between the MOS transistors used for the input differential pair of the amplifier. Offset voltage can also arise in switched-capacitor circuits from charge injection onto input capacitors by sampling switches. Low frequency noise can arise in amplifiers due to interface traps and other imperfections of the CMOS fabrication process. In a sigma-delta ADC, the offset voltage and low frequency noise can arise in the modulator section of the sigma-delta ADC.

SUMMARY OF THE INVENTION

In accordance with the present invention, an analog to digital conversion system is provided wherein a first chopper is responsive to a chop signal having a period T for passing an analog signal to an output with non-reversed polarity during a first portion of the period T and with reversed polarity during a second portion of the period T. An analog to digital converter produces a first set of at least one digital word corresponding to the analog signal with non-reversed polarity and an offset voltage and produces a second set of at least one digital word corresponding to the analog signal with reversed polarity and the offset voltage. A second chopper is responsive to the chop signal for passing to an output of the second chopper one of the produced first and second sets with non-reversed polarity, and passing to the output of the second chopper the other one of produced first and second sets with reversed polarity. A filter is fed by the output of the second chopper for producing, on receipt of the produced first set, a first output digital word and, on receipt of the produced second set, a second output digital word, with the offset voltage being removed from each of such output digital words.

In a preferred embodiment of the invention, a signal conditioning circuit is fed by the output of the first chopper for producing a first conditioned signal during the first portion of the period T and a second conditioned signal during the second portion of the period T. The analog to digital converter produces the first set of at least one digital word corresponding to the first conditioned signal and the offset voltage and produces the second set of at least one digital word corresponding to the second conditioned signal and the offset voltage. The second chopper is responsive to the chop signal for passing to an output of the second chopper one of the produced first and second sets with non-reversed polarity, and for passing to the output of the second chopper the other one of produced first and second sets with reversed polarity. The filter is fed by the output of the second chopper for producing, on receipt of the produced first digital word, a first output digital word and, on receipt of the produced second digital word, a second output digital word, with the offset voltage being removed from each of such output digital words.

In one embodiment, the analog to digital converter is a successive approximation register (SAR) analog to digital converter (ADC), a flash ADC, or a sigma-delta ADC including both its modulator and decimating filter and produces as the first and second sets N-bit digital words, where N is typically 8, 12 or 16. Each N-bit digital word corresponds to a sample of the signal fed to the ADC taken at the Nyquist sampling rate.

In another embodiment, the analog to digital converter is a sigma-delta modulator and produces as the produced first set, a first sequence of one-, or two-bit digital words and as the produced second set, a second sequence one-, or two-bit digital words. Each one of the one-, or two-bit digital words in the sequence thereof corresponds to a sample of the signal fed to the sigma-delta modulator taken at a rate many times higher than the Nyquist sampling rate. Therefore, the one-, or two-bit digital words are relatively low resolution digital words compared with the higher resolution N-bit digital words produced by the ADC in the first embodiment. Thus, with the sigma-delta modulator, a first sequence of low resolution digital words is produced corresponding to the analog signal with non-reversed polarity and a second sequence of low resolution digital words is produced corresponding to the analog signal with reversed polarity. The second chopper passes to an output of the second chopper one of the produced first and second sequences of low resolution digital words with non-reversed polarity, and passes to the output of the second chopper the other one of produced first and second sequences of low resolution digital words with reversed polarity. The filter fed by the output of the second chopper includes a decimating filter and an output filter. The decimating filter produces a first high resolution N-bit digital word corresponding to the produced first sequence of low resolution digital words and a second high resolution N-bit digital word corresponding to the produced second sequence of low resolution digital words. The output of the decimating filter is fed to the output filter for producing, on receipt of the first high resolution N-bit digital word, a first output digital word and, on receipt of the second high resolution N-bit digital word, a second output digital word, with the offset voltage being removed from each of such output digital words.

In accordance with another feature of the invention, the signal conditioning circuitry includes a bridge circuit. The bridge circuit is coupled to a force reference potential through the first chopper. The force reference potential provides the analog signal for the first chopper. The output of the bridge circuit produced in response to an input being measured is fed to the analog to digital conversion system for conversion into corresponding digital words.

In accordance with still another feature of the invention, a bridge sense potential, produced across the bridge circuit in response to a force reference potential is passed to the analog to digital conversion system with proper polarity to provide a reference potential for the analog to digital conversion system.

BRIEF DESCRIPTION OF THE DRAWING

Other features of the invention will become more readily apparent with reference to the following description taken together with the following drawings, in which.

DESCRIPTION OF THE PREFERRED EMBODIMENTS

Figure 1:
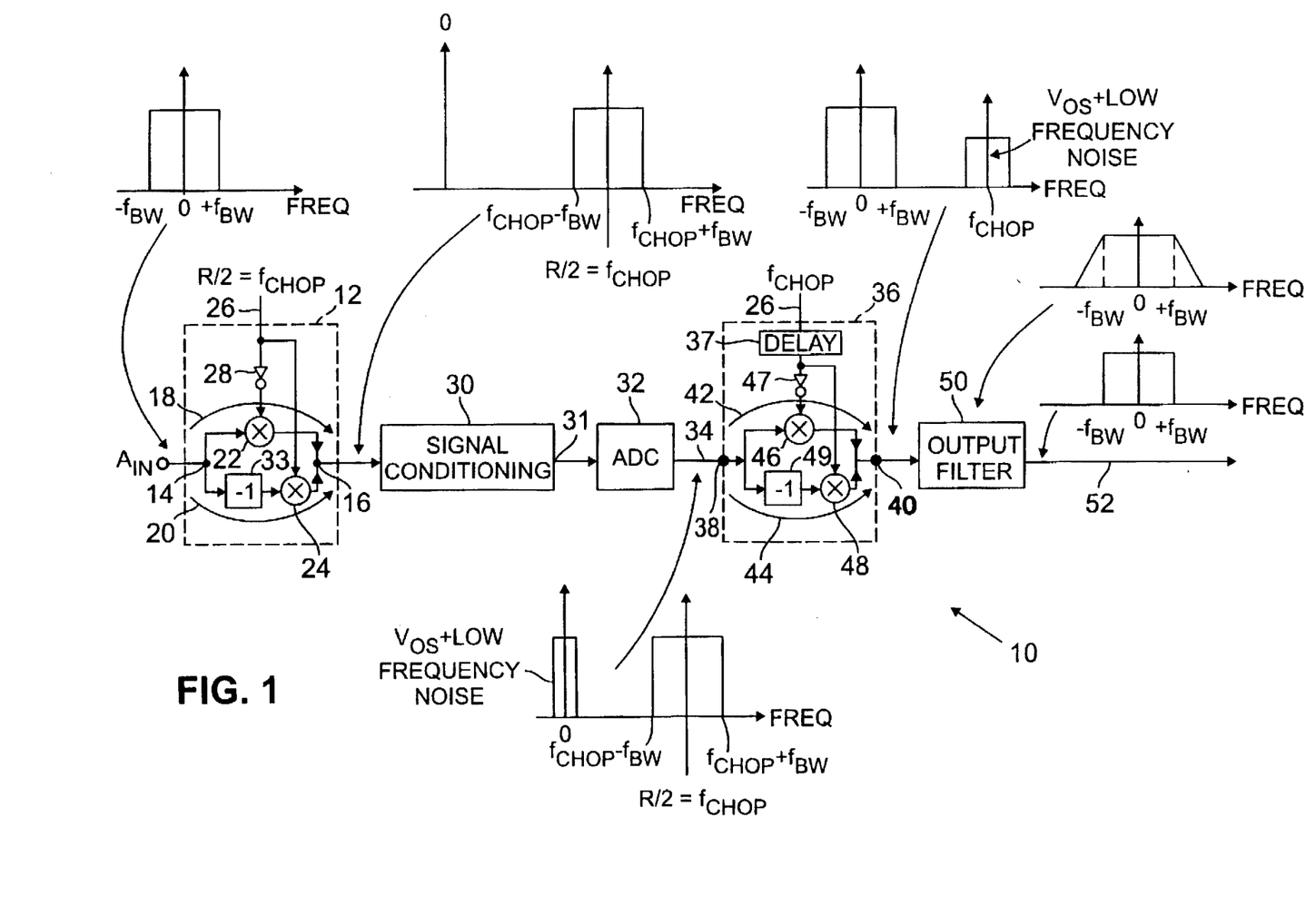
FIG. 1 is a schematic block diagram of the analog to digital conversion system according to the invention.
Figure 2A:
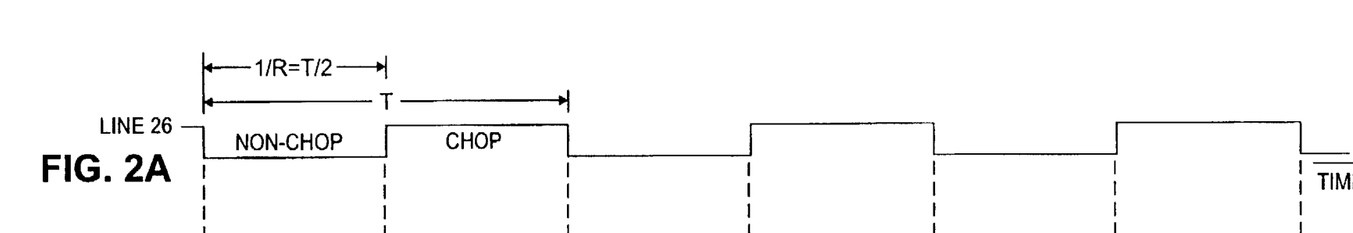
FIGS. 2A through 2E are timing diagrams useful in understanding the analog to digital conversion system of FIG. 1.

Referring now to FIG. 1, an analog to digital conversion system 10 is shown. The system 10 includes a first chopper 12. The first chopper 12 has an input terminal 14 and an output terminal 16. The input terminal 14 is coupled to the output terminal 16 through two channels 18, 20, as shown. Each one of the channels 18, 20 includes a switch 22, 24, respectively, as shown. A train of binary signals (i.e., chop signals) is fed to the switches 22, 24 via line 26, as shown. The train of binary signals on line 26 is shown in FIG. 2A. Thus, the train of binary signals has a period, T, as shown in FIG. 2A and a frequency $f_{CHOP}=1/T$. It is noted that while line 26 is coupled directly to switch 24, line 26 is coupled to switch 22 through an inverter 28, as shown. Also, it should be noted that an inverting, unity gain amplifier 33 is serially connected between the input terminal 14 and the output terminal 16 in channel 20, as shown.

Figure 2B:
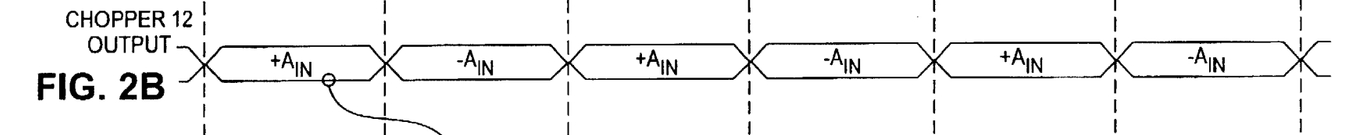

Thus, in operation, assume an analog signal, $A_{IN}$, is fed to input terminal 14. In response to one state of the binary signal on line 26, here, for example, when the binary signal on line 26 is logic 0, during the first half of each period, T, (i.e., during 0 to T/2) switch 22 is closed to pass the analog signal on input terminal 14 to output terminal 16 without any change in polarity in the input analog signal $A_{IN}$. During this first half of each period, T, (i.e., during 0 to T/2) switch 24 is in an open circuit condition. One the other hand, during the next half period T/2 (i.e., from T/2 to T), when the binary signal on line 26 changes to a logic 1, switch 22 is opened and switch 24 is closed to thereby produce at output terminal 16 during this half period from T/2 to T, the input analog signal $A_{IN}$ with reversed polarity, i.e., the analog signal $-A_{IN}$, because of inverting amplifier 33. Thus, the first chopper 12 successively reverses the polarity of the analog signal, $A_{IN}$, at a rate, $R=2/T=2f_{CHOP}$. That is, the first chopper 12 is responsive to the chop signal on line 26 having the period T and passes the analog signal $A_{IN}$ to output 16 with non-reversed polarity (i.e., the signal $+A_{IN}$) during a first portion of the period T and with reversed polarity $(-A_{IN})$ during a second portion of the period T, as shown in FIG. 2B.

A signal conditioning circuit 30 is fed by the output 16 of the first chopper 12. The signal conditioning circuit 30, here an amplifier, is fed by the signals produced by the first chopper 12 at output 16 to produce corresponding analog signals at the output 31 of circuit 30. Thus, the signal conditioning circuit 30 is fed sequentially by the signals $+A_{IN}$ and $-A_{IN}$, for producing with periodicity, T, a sequence of pairs of successive signals, $A'_{IN}+V_{OSSC}$ and $-A'_{IN}+V_{OSSC}$, where $V_{OSSC}$ is any offset voltage produced by the signal conditioning circuit 30. Thus, the signal conditioning circuit 30 is fed by the output of the first chopper 12 for producing a first conditioned signal, $A'_{IN}+V_{OSSC}$, during the first portion of the period T and a second conditioned signal, $-A'_{IN}+V_{OSSC}$, during the second portion of the period T.

Figure 2C:
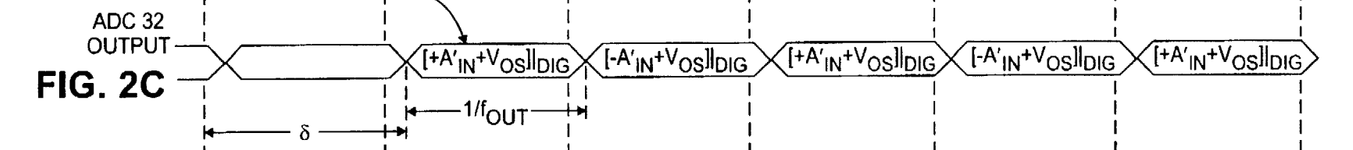

An analog to digital converter 32, here a successive approximation register (SAR) analog to digital converter (ADC), a flash ADC, or a sigma-delta ADC including both its modulator and decimating filter, is provided for converting the conditioned signals produced by the signal conditioning circuit 30 at output 31 into sets of at least one digital word, here into a set of one corresponding high resolution parallel N-bit digital word, and producing such sets on an output bus 34. The digital words are produced by the ADC at a rate, $f_{OUT}$, here at the rate $R=2/T$, as shown in FIG. 2C. As noted in FIG. 2C, each one of the produced words includes, as a portion thereof, an offset voltage, $V_{OS}$, corresponding to the total offset of the signal conditioning circuit and the analog to digital converter 32. Thus, the ADC 32 produces a first digital word, $[+A'_{IN}+V_{OS}]|DIG$, corresponding to the first conditioned signal, $+A'_{IN}+V_{OSSC}$, and produces a second digital word, $[-A'_{IN}+V_{OS}]|DIG$, corresponding to the second conditioned signal, $-A'_{IN}+V_{OSSC}$, each one of such produced digital words including therein the offset voltage, $V_{OS}$, as shown in FIG. 2C. That is, the digital words $[+A'_{IN}+V_{OS}]|DIG$, $[-A'_{IN}+V_{OS}]|Die$, . . . are produced by the ADC 32 at a rate $f_{OUT}$. Here, $f_{OUT}=R$.

It should be noted that the rate $f_{OUT}$ may be greater than the rate R, as shown in FIGS. 2C' where the ADC 32 produces the digital words at a rate, $f'_{OUT}=2R$. In such case, a sequence of digital words produced at the rate $f'_{OUT}=2R$, is: $[+A'_{IN}+V_{OS}]|DIG$; $[+A'_{IN}+V_{OS}]|DIG$; $[-A'_{IN}+V_{OS}]|_{DIG}$; and $[-A'_{IN}+V_{OS}]|DIG$ . . . , as shown. That is, the analog to digital converter here produces a set of two digital words, $[+A'_{IN}+V_{OS}] |DIG$; $[+A'_{IN}+V_{OS}]|DIG$ corresponding to the first conditioned signal, $+A'_{IN}+V_{OSSC}$ and a set of two digital words $[-A'_{IN}+V_{OS}]|DIG$; $[-A'_{IN}+V_{OS}]|DIG$, corresponding to the second conditioned signal, $-A'_{IN}+V_{OSSC}$, as shown in FIG. 2C'.

Figure 2D:
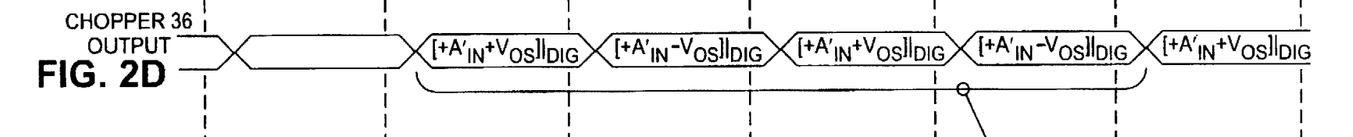

A second chopper 36 is fed by the digital words $[+A'_{IN}+V_{OS}]|_{DIG}$ and $[-A'_{IN}+V_{OS}]|DIG$, produced by the analog to digital converter at the rate $f_{OUT}$, and produces, with the periodicity T, corresponding digital words $[+A'_{IN}+V_{OS}]|DIG$ and $[+A'_{IN}-V_{OS}]|DIG$. Thus, the second chopper 36 successively reverses at the rate R the polarity of the digital words produced by the ADC 32 on line 34. It is first noted that the second chopper 36 is fed with the series of digital words, on line 34. Thus, the second chopper 36 while functionally equivalent to the first chopper 12, uses digital processing to provide its function. Thus, for purpose of understanding, the second chopper is functionally represented in FIG. 1 as having an input terminal 38 and an output terminal 40. The input terminal 38 is coupled to the output terminal 40 through two channels 42, 44, as shown. Each one of the channels 42, 44 includes a switch 46, 48, respectively, as shown. The train of binary signals is fed to the switches 46, 48 via line 26, as shown. The train of binary signals on line 26 is, as noted above, shown in FIG. 2A. Thus, the train of binary signals has a period, T, as shown in FIG. 2A. It is noted that line 26 is coupled to a delay 37. While the output of delay 37 is coupled directly to switch 48, the output of delay 37 is coupled to switch 48 through an inverter 47, as shown. Also, it should be noted that an inversion 49 is provided serially between the input terminal 38 and the output terminal 40 in channel 44, as shown. The delay 37 is provided to account for conversion delay in the ADC 32. Here, the delay 37 in the example shown in FIG. 2C is 8, as shown. In the example shown in FIG. 2C', the delay 37 is 6' as shown Thus, the second chopper 36 is fed by the digital words $[+A'_{IN}+V_{OS}]|DIG$ and $[-A'_{IN}+V_{OS}]|DIG$, and produces during each period, T, a pair of corresponding digital words $[+A'_{IN}+V_{OS}]|DIG$ and $[+A'_{IN}-V_{OS}]|DIG$. That is, the second chopper 36 successively reverses the polarity of the digital words produced by the ADC 32 at the rate R. Thus, in operation, digital words produced at the output of ADC 32 corresponding to the first half of each period T, i.e., corresponding to 0 to T/2, appear without a reversal in polarity at output 40 of the second chopper 36, as shown in FIG. 2D. On the other hand, corresponding to the next half period T/2 (i.e., from T/2 to T), the digital words produced at the output of ADC 32 appear with a reversal in polarity at output 40 of the second chopper 36, as shown in FIG. 2D.

To put it another way, the second chopper 34 is responsive to the chop signal on line 26 and passes to output 40 of the second chopper 36 one of the produced first and second digital words, $[+A'_{IN}+V_{OS}]|_{DIG}[-A'_{IN}+V_{OS}]|_{DIG}$, with non-reversed polarity, and passes to the output 40 the other one of produced first and second digital words $[+A'_{IN}+V_{OS}]|_{DIG}$, $[-A'_{IN}+V_{OS}]|_{DIG}$ with reversed polarity. For example, referring to FIGS. 2C and 2D, here the digital words $[+A'_{IN}+V_{OS}]|_{DIG}$ are passed to output 40 with non-reversed polarity and the digital words $[-A'_{IN}+V_{OS}]|_{DIG}$ are passed to output 40 with reversed polarity. It should be noted that in the example discussed in connection with FIG. 2C', two digital words $[+A'_{IN}+V_{OS}]|_{DIG}$; $[+A'_{IN}+V_{OS}]|_{DIG}$ are passed to output 40 with non-reversed polarity and two digital words $[-A'_{IN}+V_{OS}]|DIG$; $[-A'_{IN}+V_{OS}]|_{DIG}$ are passed to output 40 with reversed polarity.

Figure 2E:
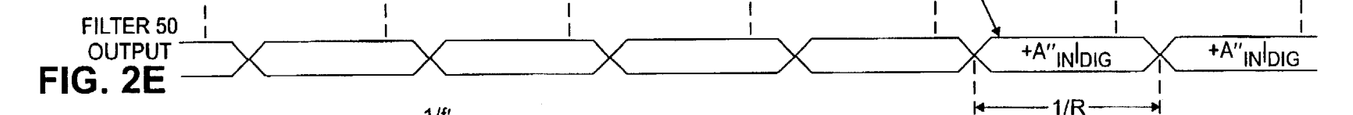

An output filter 50 is fed by the output of the second chopper 36 and produces, on receipt of the produced first digital word $[+A'_{IN}+V_{OS}]|_{DIG}$, a first output digital word $A''_{IN}|_{DIG}$ and, on receipt of the produced second digital word $[-A'_{IN}+V_{OS}]|_{DIG}$, a second output digital word $A''_{IN}|_{DIG}$, with the offset voltage being removed from each of such output digital words, as shown in FIG. 2E. Thus, as each new digital word is produced by the ADC 32, a new digital word is produced by the output filter 50. Here output filter 50 is a filtering system described in copending patent application Ser. No. 08/600,296 entitled "Digital Filtering System", inventors Adrian Sherry, Damien McCartney and Michael Byrne, assigned to the same assignee as the present invention and filed concurrently herewith, the contents of such copending patent application being incorporated herein by reference.

To put it another way, the output filter 50 is fed by the sequence of digital words $[+A'_{IN}+V_{OS}]|_{DIG}$ and $[+A'_{IN}-V_{OS}]|_{DIG}$, produced by the second chopper 36 at output 40. The output filter 50 removes the $V_{OS}|_{DIG}$ portion of the sequence of digital words by filtering over a predetermined period of time. For purposes of understanding when referring to FIG. 2E, the digital words $[+A'_{IN}+V_{OS}]|_{DIG}$, $[+A'_{IN}-V_{OS}]|_{DIG}$, produced by the second chopper 36 at output 40 are filtered over 2T by filter 50 to thereby remove the offset voltage $V_{OS}|_{DIG}$ components. It is noted that the output filter 50 produces at an output 52 thereof the sequence of digital words $A''_{IN}|_{DIG}$ at the same rate as the digital words are produced by the ADC 32, i.e., $f_{OUT}$, here R=2/T as shown in FIG. 2C. (It should be noted that in the case where $f_{OUT}$ is greater than R, for example where the ADC rate is $f_{OUT}$=2R, as shown in FIG. 2C' the output filter 50 may produce the digital words $A''_{IN}|_{DIG}$ at the same rate 2R or the lower rate R. In any event, the output filter 50 produces a digital word corresponding to the non-chop interval and a digital word corresponding to the chop interval). The averaging process of the output filter 50 rejects from the produced words the offset voltage $V_{OS}|_{DIG}$ and sequentially produces at the ADC 32 conversion output rate, $f_{OUT}$, which is equal to or greater than R, the digital words corresponding to the analog signal produced by the signal conditioning circuit 30. That is, the output filter 50 is fed by the digital words $[+A'_{IN}+V_{OS}]|_{DIG}$ and $[+A'_{IN}V_{OS}]|_{DIG}$, for removing therefrom $V_{OS}$, and for producing at an output a digital word $A''_{IN}|_{DIG}$ for the digital word $[+A'_{IN}+V_{OS}]|_{DIG}$ and an output digital word $A''_{IN}|_{DIG}$ for the digital word $[+A'_{IN}-V_{OS}]|_{DIG}$. Thus, on receipt of the produced first digital word, $[+A'_{IN}+V_{OS}]|_{DIG}$, a first output digital word is produced by the output filter 50 and, on receipt of the produced second digital word, $[+A'_{IN}-V_{OS}]|_{DIG}$, a second output digital word is produced with the offset voltage being removed from each of such output digital words.

FIG. 1 also shows the effect of the choppers 12, 36 and filter 50 on the frequency spectrum of various signals in the system 10. Thus, if the bandwidth of the analog signal fed to input terminal 14 is from 0 (i.e., DC) to $f_{BW}$, as shown, the chopper 12 shifts the input signal frequency spectrum to the chopper frequency, $f_{CHOP}$, as shown. The signal conditioning circuit and/or ADC 32 may add an offset voltage, $V_{OS}$, and low frequency noise, as shown in FIG. 1. The chopper 36 shifts the frequency spectrum of the signal produced at the output 34 of the ADC 32 so that the input signal spectrum is centered around DC, as shown, and the offset voltage and low frequency noise spectrum is centered at $f_{CHOP}$, as shown. (It is noted in FIG. 2D that the digital words $A'_{IN}|_{DIG}$ do not change polarity and therefore are at DC but the digital words $V_{OS}|_{DIG}$ change polarity with a periodicity T; i.e., have a frequency $f_{CHOP}$=1/T). The output filter 50 is a low pass filter having a bandwidth, $f_{BW}$. The frequency spectrum of the signal produced at the output of filter 50 is shown in FIG. 1 to have removed therefrom, the offset voltage and low frequency noise.

Figure 3:
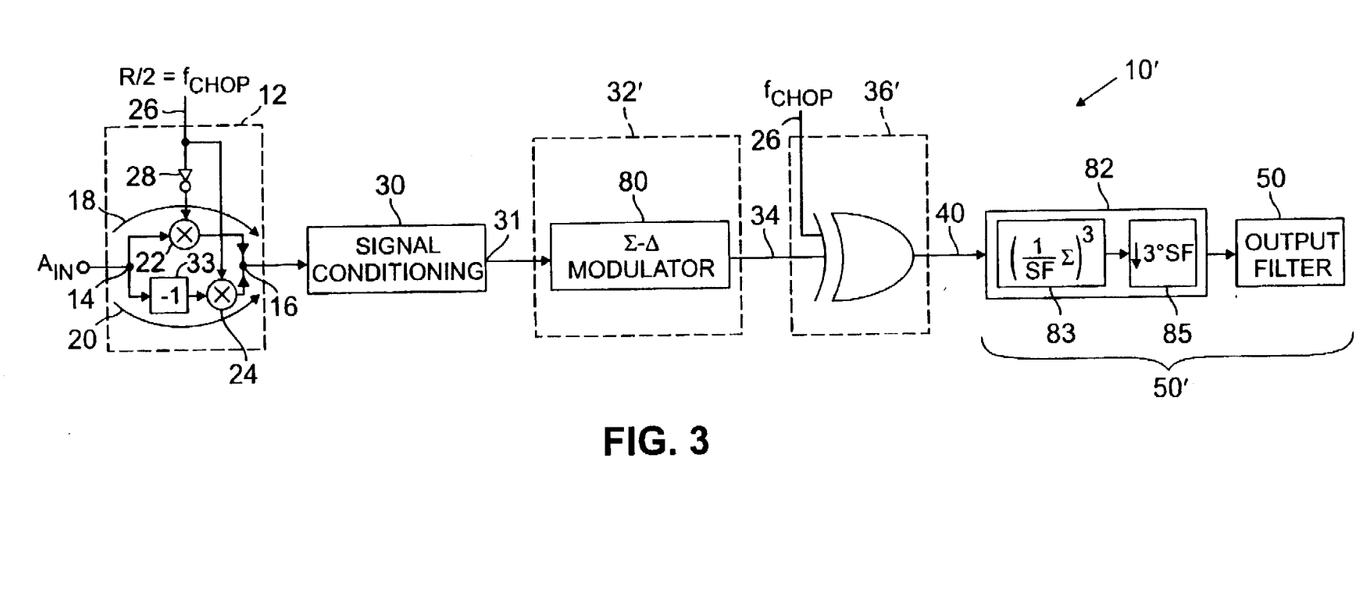
FIG. 3 is a schematic block diagram of the analog to digital conversion system according to another embodiment of the invention.
Figure 4A:
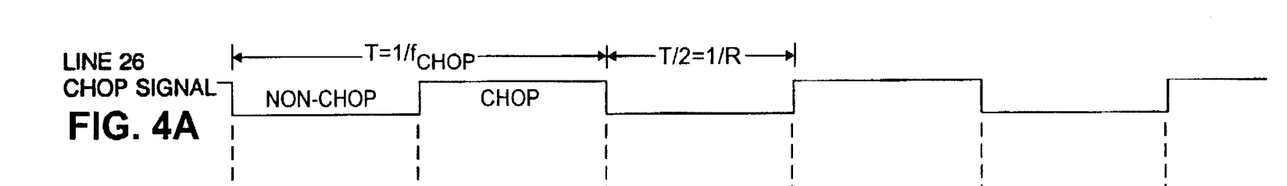
FIGS. 4A through 4F are timing diagrams useful in understanding the analog to digital conversion system of FIG. 3
Figure 4B:
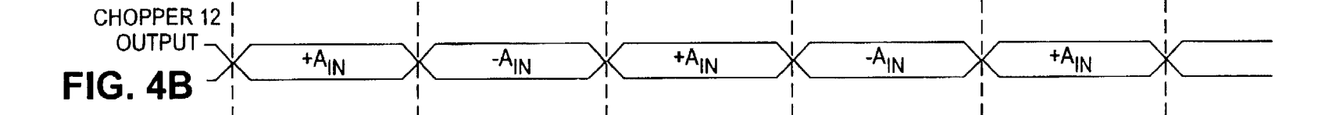
Figure 4C:
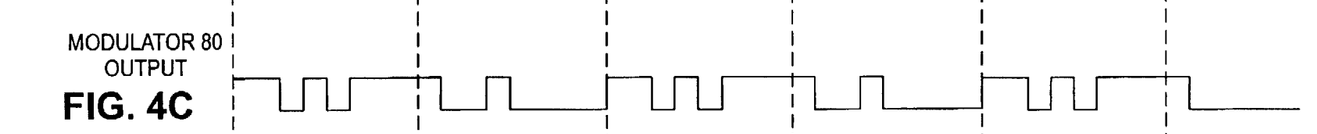

Referring now to FIG. 3, an analog to digital conversion system 10', here a sigma-delta analog to digital conversion system, is shown. As noted in connection with FIG. 1, ADC 32 may be a sigma-delta ADC which includes a sigma-delta modulator and a decimating filter. Here, in FIG. 3, the ADC 32' is a sigma-delta modulator 80 which produces sequences of low resolution (i.e., one- or two-bit digital words) and the second chopper 36 is placed between the sigma-delta modulator 80 and its decimating filter 82. More particularly, the sigma-delta modulator 80 produces as the first set of digital words a sequence of one-, or two-bit digital words and as the second set of digital words a sequences of one-, or two-bit digital words. The one-, or two-bit digital words in the first and second sequences thereof correspond are produced by the sigma-delta modulator at rate many times higher than the Nyquist sampling rate used by the ADC 32 of FIG. 1. Here produced at a rate $f_{MOD}$. Therefore, the one-, or two-bit digital words produced by the sigma-delta modulator of FIG. 3 are relatively low resolution digital words compared with the higher resolution N-bit digital words produced by the ADC 32 of FIG. 1. However, with the sigma-delta modulator, a first sequence of, here a sequence of 1536, low resolution one-bit digital words, is produced corresponding to the analog signal with non-reversed polarity and a second sequence of, here a sequence of 1536, low resolution one-bit digital words is produced corresponding to the analog signal with reversed polarity as shown in FIGS. 4A–4C. Thus, for example, and assuming for purposes of illustration that each of the sequences of one-bit digital words includes 8 words instead of the 1536 digital words discussed above, and that the input signal $A_{IN}$ is substantially constant during the period T, the sequence of one-bit digital words produced by modulator 80 during the non-chop interval may be 1,1,0,1, 0,1,1,1 while the sequence of one-bit binary words produced during the succeeding chop interval may be 1,0,0,1,0,0,0,0. It is noted that the 1's density (i.e., the ratio of the number of 1's to the total number of one-bit digital words) is ⅝ in the non-chop interval and ⅔ in the chop interval, assuming that the 1's density is ⅝ for an analog input $A_{IN}$ of zero volts. While in FIG. 4C the sequence of one-bit digital words is shown as the same in succeeding non-chop intervals, in practice the sequences will diverge somewhat due to the presence of noise. However, the 1's density will be the same assuming again that the input $A_{IN}$ is substantially constant.

Figures 4D, 4E:
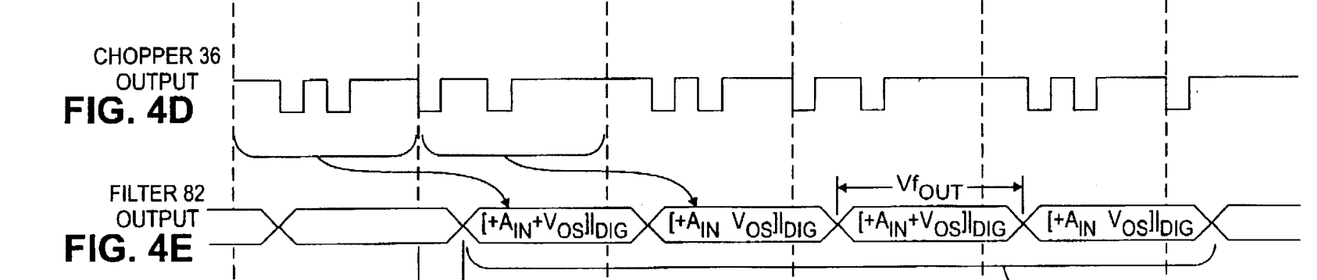

The second chopper 36 in FIG. 1 is here an exclusive OR gate 36'. When the chop signal, $f_{CHOP}$, on line 26 is a logic 0, the sequence of low resolution one-bit digital words on line 34 is passed to output 40 without inversion (i.e., with non-reversed polarity) and when the chop signal $f_{CHOP}$ on line 34 is logic 1, the sequence of one-bit digital words on line 34 is passed to output/40 with inversion (i.e., with reversed polarity), as described in connection with FIG. 1 and as shown in FIG. 4D. It is noted that the delay 37 in chopper 36 (FIG. 1) is no longer required because there is no delay through the sigma-delta modulator 80. Thus, in the example discussed above, the second chopper 36' produces 1,1,0,1,0,1,1,1 during the non-chop interval and the sequence 0,1,1,0,1,1,1,1 (i.e., the complement of 1,0,0,1,0, 0,0,0) during the chop interval.

The filter 50' is fed by the output 40 of the second chopper 36. Here, filter 50' includes a decimating filter 82 and the output filter 50. The decimating filter 82 produces a first high resolution N-bit digital word corresponding to the first sequence of low resolution digital words with a delay, 6", after the end of the first sequence and, produces a second high resolution N-bit digital word corresponding to the second sequence of low resolution digital words with a delay, δ", after the end of the second sequence, as shown in FIG. 4E.

Figure 4F:
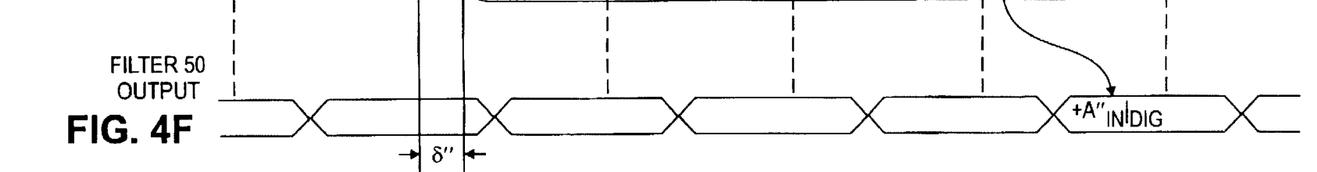

The output of the decimating filter 82 is fed to the output filter 50 for producing, on receipt of the first high resolution N-bit digital word, a first output digital word and, on receipt of the second high resolution N-bit digital word, a second output digital word, with the offset voltage being removed from each of such output digital words, as shown in FIG. 4F and as described in connection with FIGS. 1 and 2A–2E.

Here, the decimating filter 82 is here a so-called $Sinc^3$ filter. The $Sinc^3$ filter 82 is the cascade of three moving average filters 83. The averaging factor SF is the same for each of the three averages. When decimation by the same factor SF is employed a very efficient realization of the filter can result, as described in a paper entitled "An economical class of digital filters for decimation and interpolation" by Eugene B. Hogenauer, published in IEEE Transactions on Acoustics, Speech, and Signal Processing, Vol. ASSP-29, No. 2, April 1981, pp. 155–162. The settling time of the filter is 3*SF-2 inputs. If decimating by SF the third output after a step input change (such as after a chop signal leading or trailing edge) is fully settled. Therefore the first two outputs are ignored, i.e. a further decimation by 3 is performed. Therefore decimation (↓) by 3*SF is shown in the block 85. If $f_{MOD}$ denotes the modulator 80 clock rate then the rate out of the decimating filter 82 (and the final output rate assuming no decimation in the output filter 50) is:

$$f_{OUT} = \frac{f_{MOD}}{3SF} \quad (1)$$

The rate at which chopping will occur is half this (assuming one conversion per chop or non-chop interval):

$$f_{CHOP} = \frac{f_{OUT}}{2} = \frac{f_{MOD}}{6SF} \quad (2)$$

A delay in initializing the analog to digital conversion might be desirable after a chop edge in order to allow for the signal conditioning circuit to settle. The most convenient way to insert a delay after the chop edge is to blank out a certain number of modulator cycles. Let DL be the number of such cycles. The filter will then use the 3*SF modulator outputs after this to compute the ADC output. The output and chop rates will now be:

$$f_{OUT} = \frac{f_{MOD}}{DL + 3SF} \quad (3)$$

$$f_{CHOP} = \frac{f_{MOD}}{2DL + 6SF} \quad (4)$$

One could let the modulator continue functioning as normal through the chop edge. It is preferable however to reset the modulator at the edge. In the preferred embodiment the reset is held for one cycle for the case DL=0 and for 1+DL cycles when DL is non-zero. Reset means holding outputs of the sigma-delta modulator integrators (not shown) at a reset voltage and forcing the output of the sigma-delta modulator 80 comparator, not shown, to 0 or 1. The reset has the effect of making the modulator 80, once it is released from reset, have no knowledge of what the input was prior to the chop edge or during the settling delay.

Note that while 3*SF-1 cycles elapse after the reset cycle only 3*SF-2 are used to compute the ADC 32' output. One cycle is therefore redundant. It is possible to conceive of a case where one might allow more redundant cycles, for example to settle out the modulator 80. This is not necessary here however.

The function of the output filter 50 is to reject the offset $V_{OS}|_{DIG}$ which has been modulated up to the frequency $f_{CHOP}$=four/2' It also sets the overall frequency response of the system 10"; the filter 50 can be designed to provide specified pass-band and stop-band frequencies, passband ripple and stop-band attenuation. As the input is effectively sampled at $f_{OUT}$=R the normal Nyquist Criterion applies: interfering frequencies above $f_{OUT}/2$ will alias down. The $Sinc^3$ filter 82 will attenuate most of these frequencies but there may be little attenuation up to $f_{OUT}$ and this frequency in particular will alias right onto DC. It might therefore be desirable to provide an analog anti-alias filter before the modulator 80.

As an example of one particular implementation:

$$f_{MOD} = 307.2 \text{ kHZ} \quad (5)$$

$SF=512$ (6)

$DL=0$ (7)

Therefore, $f_{OUT}=200$ Hz (8)

and $f_{CHOP}=100$ Hz (9)

A chop frequency of 100 Hz will be perfectly adequate for offset and offset drift removal, however, it may not be high enough to remove all the (1/f) low frequency noise, particularly from CMOS amplifiers. It is perfectly reasonable therefore to additionally chop individual amplifiers in the signal conditioning circuit 30 or sigma-delta modulator at much higher frequencies.

Here, the output filter 50 is a FIR filter with 22 coefficients. Here, such filter 50 achieves a pass-band-3 dB frequency of 7.9 Hz and a stop-band of attenuation of greater than 64.5 dB above 28 Hz for the system frequency response.

Figure 5:
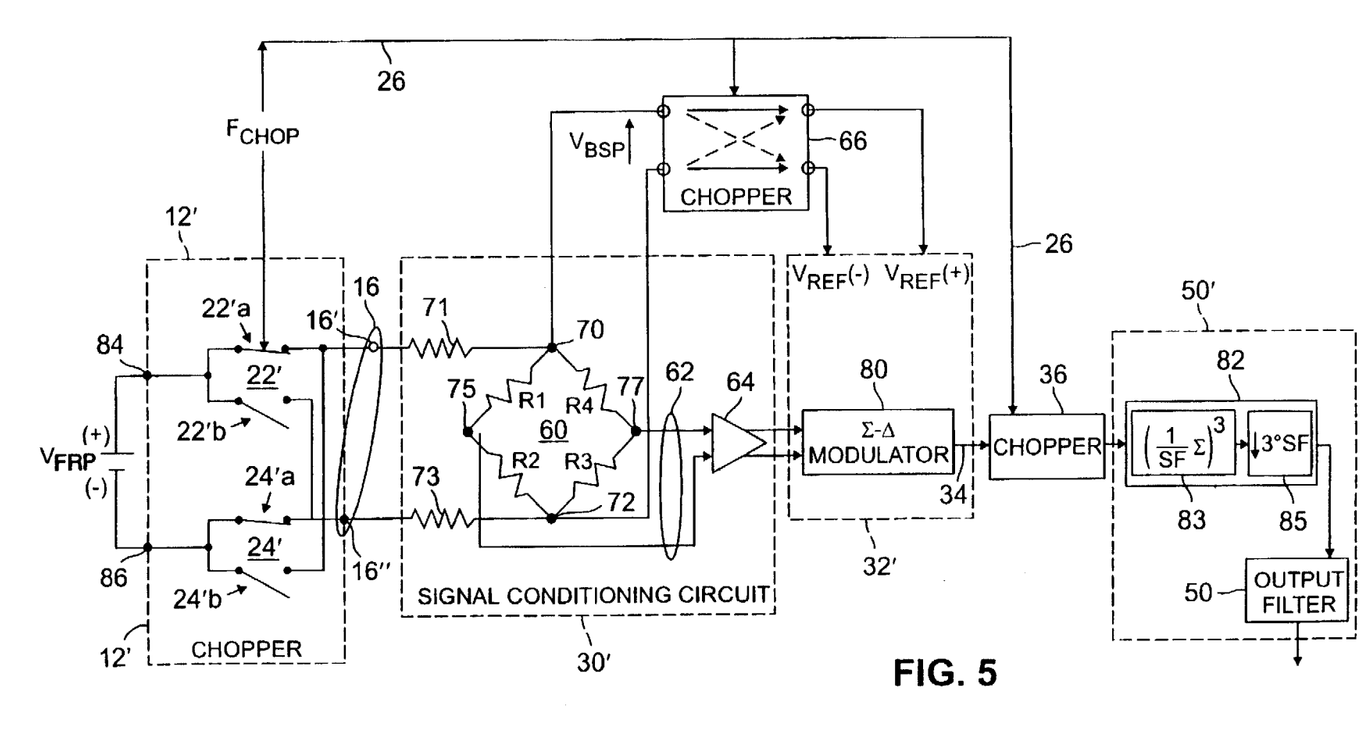
FIG. 5 is a schematic block diagram of the analog to digital conversion system according to an alternative embodiment of the invention.

Referring now to FIG. 5, a measurement analog to digital conversion system 10" is shown. Here, the signal conditioning circuitry 30' includes a bridge circuit 60. The bridge circuit is a conventional resistive type bridge where a change in the resistance of at least one of the resistors R1, R2, R3, R4, here resistor R4, changes the output potential between terminals 75, 77. The bridge circuit 60 is coupled to a fixed force reference potential $V_{FRP}$ through the first chopper 12', as shown. The force reference potential $V_{FRP}$ provides the analog signal ($A_{IN}$, FIG. 1) for the first chopper 12'.

Here, chopper 12' includes two pairs of switches 22' 24', as shown. One pair 22' includes a switch 22'a and 22'b, as shown. The other pair 24' includes 24'a and 24'b, as shown. The switches 22'a, 22'b, 24'a, and 24'b are controlled by the binary control signal on line 26 shown and discussed above in connection with FIGS. 1 and 2A. The inputs of switches 22'a, 22'b are connected to the positive (+) potential of $V_{FRP}$, as shown. The inputs of switches 24'a, 24'b are connected to the negative (−) potential of $V_{FRP}$, as shown. When switch 22'a is in a closed circuit condition, as shown, switch 22'b is in an open circuit position, as shown. Likewise, when switch 24'a is in a closed circuit condition, as shown, switch 24'b is in an open circuit position, as shown. These positions exist for one half period, 0 to T/2 as shown in FIG. 2A; i.e., when the binary signal on line 26 is here logic 0. Thus, during the first half period, the positive terminal (+) of $V_{FRP}$ is coupled to output 16' through closed switch 22'a and the negative terminal(−) of $V_{FRP}$ is coupled to output 16" through then closed switch 24'a. During the second half period, T/2 to T when the binary signal on line 26 is logic 1, the positive terminal (+) of $V_{FRP}$ is coupled to output 16" through then closed switch 22'b and the negative terminal (−) of $V_{FRP}$ is coupled to output 16' through then closed switch 24'b. The terminals 16', 16" thereby provide the output 16 (FIG. 1) of the chopper 12' (FIG. 5).

The output terminals 16', 16" of chopper 12', which together provide a signal line pair 16, are coupled to terminals 70, 72 of bridge 60, respectively, through wiring resistances 71, 73, respectively, as shown. The output 62 of the bridge circuit 60 (i.e., the potential produced between terminals 75, 77) is produced in response to an input being measured changing the resistance of resistor R4. The output 62 is fed, after additional signal conditioning, here provided by amplifier 64, as shown, included in the signal conditioning circuit 30', to the analog to digital converter 32' for conversion into a first set of at least one digital word on line 34 corresponding to the first conditioned signal and an offset voltage and for producing a second set of at least one digital word on line 34 corresponding to the second conditioned signal and the offset voltage, (i.e., a first sequence of low resolution one-, or two-bit digital words and a second sequences of one-, or two-bit digital words, as described above in connection with FIG. 3).

The second chopper is here the exclusive OR gate 36' described in connection with FIG. 3. When the chop signal, $f_{CHOP}$, on line 26 is a logic 0, the sequence of low resolution one-bit digital words on line 34 is passed to output 40 without inversion (i.e., with non-reversed polarity) and when the chop signal $f_{CHOP}$ on line 34 is logic 1, the sequence of one-bit digital words on line 34 is passed to output 40 with inversion (i.e., with reversed polarity), as described in connection with FIG. 3 and as shown in FIG. 4D. The output of chopper 36' is fed to decimating filter 82 and produces a first high resolution N-bit digital word corresponding to the first sequence of low resolution digital words with a delay, 8", after the end of the first sequence and, produces a second high resolution N-bit digital word corresponding to the second sequence of low resolution digital words with a delay, 6", after the end of the second sequence, as shown in FIG. 4E.

The output of the decimating filter 82 is fed to the output filter 50 for producing, on receipt of the first high resolution N-bit digital word, a first output digital word and, on receipt of the second high resolution N-bit digital word, a second output digital word, with the offset voltage being removed from each of such output digital words, as shown in FIG. 4F and as described in connection with FIGS. 1 and 2A–2E.

It is noted that a bridge sense potential, $V_{BSP}$ produced across the bridge circuit 60 in response to force reference potential $V_{FRP}$, is fed to a third chopper 66. The third chopper 66 is synchronized with the first chopper 12' and produces a reference potential for the analog to digital converter 32' with the correct polarity. That is, when terminal 70 is positive with respect terminal 72, the third chopper 66 couples terminal 70 to the $V_{REF}$+terminal of the ADC 32' and the terminal 72 to the $V_{REF}$− terminal of the ADC 32'. On the other hand, when terminal 70 is negative with respect to the terminal 72, the third chopper 66 couples terminal 70 to the $V_{REF}$−terminal of the ADC 32' and the terminal 72 to the $V_{REF}$+terminal of the ADC 32'.

It will be understood that the function of the third chopper may alternatively be achieved by altering the switch control signals of the switched capacitor network, not shown, in the sigma-delta modulator 80, to which the $V_{REF}$+ and $V_{REF}$− terminals are normally coupled.

Here, the bridge circuit 60 might be excited with a DC voltage $V_{FRP}$ of 5 V (i.e., 5 V is applied to the positive input terminal 84 and 0V to the negative input terminal 86). The bridge output 62 is, as shown in FIG. 5, a differential voltage of up 10 mV. The resistor bridge 60 might suffer from offsets due to thermal EMF's in it's connections, also it's resistance (typically 350 Ω for each of it's 4 arms) will convert any input bias currents of the signal conditioning circuits into an offset. Both of these effects can be eliminated by moving the input chopping function to the excitation terminals 70, 72 as described in FIG. 5. The bridge circuit 60 will then be alternately excited with 5 V/0 V and 0 V/5 V, which is termed AC excitation, at terminals 70, 72.

Other embodiments are within the spirit and scope of the appended claims.

What is claimed is:

1. An analog to digital conversion system, comprising:
   a first chopper, responsive to a chop signal having a period T, for passing an analog signal to an output with non-reversed polarity during a first portion of the period T and with reversed polarity during a second portion of the period T;
   a signal conditioning circuit fed by the output of the first chopper for producing a first conditioned signal during the first portion of the period T and a second conditioned signal during the second portion of the period T;
   an analog to digital converter for producing a first set of at least one digital word corresponding to the first conditioned signal and an offset voltage and for producing a second set of at least one digital word corresponding to the second conditioned signal and the offset voltage;
   a second chopper, responsive to the chop signal, for passing to an output of the second chopper one of the produced first and second sets with non-reversed polarity, and passing to the output of the second chopper the other one of produced first and second sets with reversed polarity; and,
   a filter, fed by the output of the second chopper, for producing, on receipt of the produced first set, a first output digital word and, on receipt of the produced second set, a second output digital word, with the offset voltage being removed from each of such output digital words.

2. The system recited in claim 1 wherein the analog to digital converter is a sigma-delta modulator for producing as the produced first set, a first sequence of low resolution digital words and for producing as the produced second set, a second sequence of low resolution digital words;
   wherein the second chopper, in response to the chop signal, passes to an output of the second chopper one of the produced first and second sequences of low resolution digital words with non-reversed polarity, and passing to the output of the second chopper the other one of produced first and second sequences of low resolution digital words with reversed polarity; and
   wherein the filter comprises:
   a decimating filter, fed by the output of the second chopper, for producing, in response to the produced first sequence of low resolution digital words, a first high resolution digital word and, in response to the produced second sequence of low resolution digital words, a second high resolution digital word, each of such high resolution digital words including therein the offset voltage, and
   an output filter, fed by the output of the decimating filter, for producing, on receipt of the first high resolution digital word, the first output digital word and, on receipt of the second high resolution digital word, the second output digital word, with the offset voltage being removed from each of such output digital words.

3. The system recited in claim 2 wherein the decimating filter produces a plurality of high resolution digital words corresponding to the first conditioned signal.

4. The system recited in claim 2 wherein the decimating filter produces a plurality of high resolution digital words corresponding to the second conditioned signal.

5. The system recited in claim 1 wherein the signal conditioning circuitry includes a bridge circuit, and wherein the bridge circuit is coupled to a force reference potential through the first chopper circuit, the force reference potential providing the analog signal for the first chopper, and wherein an output of the bridge circuit produced in response to an input being measured is fed to the analog to digital converter for conversion into corresponding digital words.

6. The system recited in claim 5 wherein a bridge sense potential produced across the bridge circuit in response to the force reference potential is passed to the analog to digital converter with proper polarity to provide a reference potential for the analog to digital converter.

7. The system recited in claim 1 wherein the sum of the first and second portions of the period T equals the period T.

8. The system recited in claim 7 wherein the first portion of the period T is equal to the second portion of the period T.

9. An analog to digital conversion system, comprising:
   a first chopper, responsive to a chop signal having a period T, for passing an analog signal to an output with non-reversed polarity during a first portion of the period T and with reversed polarity during a second portion of the period T;
   an analog to digital converter for producing a first set of at least one digital word corresponding to the analog signal with non-reversed polarity and an offset voltage and for producing a second set of at least one digital word corresponding to the analog signal with reversed polarity and the offset voltage;
   a second chopper, responsive to the chop signal, for passing to an output of the second chopper one of the produced first and second sets with non-reversed polarity, and passing to the output of the second chopper the other one of produced first and second sets with reversed polarity; and,
   a filter, fed by the output of the second chopper, for producing, on receipt of the produced first set, a first output digital word and, on receipt of the produced second set, a second output digital word, with the offset voltage being removed from each of such output digital words.

10. The system recited in claim 9 wherein the analog to digital converter is a sigma-delta modulator for producing as the produced first set a first sequence of low resolution digital words and for producing as the produced second set a second sequence of low resolution digital words;
    wherein the second chopper, in response to the chop signal, passes to an output of the second chopper one of the produced first and second sequences of low resolution digital words with non-reversed polarity, and passing to the output of the second chopper the other one of produced first and second sequences of low resolution digital words with reversed polarity; and
    wherein the filter comprises:
    a decimating filter, fed by the output of the second chopper, for producing, in response to the produced first sequence of low resolution digital words, a first high resolution digital word and, in response to the produced second sequence of low resolution digital words, a second high resolution digital word, each of such high resolution digital words including therein the offset voltage, and
    an output filter, fed by the output of the decimating filter, for producing, on receipt of the first high resolution digital word, the first output digital word and, on receipt of the second high resolution digital word, the second output digital word, with the offset voltage being removed from each of such output digital words.

11. The system recited in claim 10 wherein the decimating filter produces a plurality of digital words corresponding to the analog signal with non-reversed polarity.

12. The system recited in claim 10 wherein the decimating filter produces a plurality of digital words corresponding to the analog signal with reversed polarity.

13. The system recited in claim 9 wherein the sum of the first and second portions of the period T equals the period T.

14. The system recited in claim 13 wherein the first portion of the period T is equal to the second portion of the period T.

15. An analog to digital conversion system, comprising:

a first section, for periodically producing a pair of signals during each period T, one of the signals in the pair being an analog signal, $+A_{IN}$, and the other signal in the pair being an analog signal, $-A_{IN}$;

signal conditioning circuitry, fed by the pair of signals $+A_{IN}$ and $-A_{IN}$, for producing a corresponding pair of signals, $+A'_{IN}+V_{OSSC}$ and $-A'_{IN}+V_{OSSC}$, where $V_{OSSC}$ is an offset voltage produced by the signal conditioning circuit;

an analog to digital converter, fed by the pair of signals $+A'_{IN}+V_{OSSC}$ and $-A'_{IN}+V_{OSSC}$, for producing corresponding digital words $[+A'_{IN}+V_{OS}]|_{DIG}$ and $[A'_{IN}+V_{OS}]|_{DIG}$, where $V_{OS}$ is the total offset voltage of the signal conditioning circuit and the analog to digital converter;

a second section, fed by the digital words $[+A'_{IN}+V_{OS}]|_{DIG}$ and $[-A'_{IN}+V_{OS}]|_{DIG}$ produced by the analog to digital converter, for producing corresponding digital words $[+A'_{IN}+V_{OS}]|_{DIG}$ and $[+A'_{IN}-V_{OS}]|_{DIG}$;

an output filter fed by the digital words $[+A'_{IN}+V_{OS}]|_{DIG}$ and $[+A'_{IN}-V_{OS}]|_{DIG}$ produced by the second section, for removing therefrom $V_{OS}$, and for producing at an output a digital word $A''_{IN}|_{DIG}$ for the digital word $[+A'_{IN}+V_{OS}]|_{DIG}$ and an output digital word $A''_{IN}|_{DIG}$ for the digital word $[+A'_{IN}-V_{OS}]|_{DIG}$.

16. An analog to digital conversion system, comprising:

a pair of input terminals for providing an analog signal, $A_{IN}$;

a first section, fed by the analog signal at the pair of terminals and a train of switching signals having successively alternating binary switching states with periodicity, T, such first section having a pair of output terminals, such first section coupling a first one of the pair of input terminals to a first one of the pair of output terminals and a second one of the pair of input terminals to a second one the output terminals in response to a first one of the binary switch states to produce a voltage $+A_{IN}$ between the output terminals and for coupling the first one of the pair of input terminals to the second one of the pair of output terminals and the second one of the pair of input terminals to the first one of the output terminals in response to a second one of the binary switch states to produce a voltage $-A_{IN}$ between the output terminals;

signal conditioning circuit, fed by the pair of signals $+A_{IN}$ and $-A_{IN}$, for producing a corresponding pair of signals, $+A'_{IN}+V_{OSSC}$ and $-A'_{IN}+V_{OSSC}$, where $V_{OSSC}$ is an offset voltage produced by the signal conditioning circuit;

an analog to digital converter, fed by the pair of signals $+A'_{IN}+V_{OSSC}$ and $-A'_{IN}+V_{OSSC}$, for producing corresponding digital words $[+A'_{IN}+V_{OS}]|DIG$ and $[A'_{IN}+V_{OS}]|DIG$, where $V_{OS}$ is the total offset voltage of the signal conditioning circuit and the analog to digital converter;

a second section, fed by the digital words $[+A'_{IN}+V_{OS}]|_{DIG}$ and $[-A'_{IN}+V_{OS}]|_{DIG}$ and the train of switching signals for producing corresponding digital words $[+A'_{IN}+V_{OS}]|_{DIG}$ and $[+A'_{IN}-V_{OS}]|_{DIG}$;

an output filter fed by the digital words $[+A'_{IN}+V_{OS}]|_{DIG}$ and $[+A'_{IN}-V_{OS}]|_{DIG}$ produced by the second section, for removing therefrom $V_{OS}$, and for producing at an output a digital word $A''_{IN}|_{DIG}$ for the digital word $[+A'_{IN}+V_{OS}]|_{DIG}$ and an output digital word $A''_{IN}|_{DIG}$ for the digital word $[+A'_{IN}-V_{OS}]|_{DIG}$.

* * * * *